United States Patent
Nakata

(10) Patent No.: US 7,528,589 B2
(45) Date of Patent: May 5, 2009

(54) STEP-UP DC/DC CONVERTER AND ELECTRONIC APPLIANCE THEREWITH

(75) Inventor: Kenichi Nakata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 106 days.

(21) Appl. No.: 11/784,874

(22) Filed: Apr. 9, 2007

(65) Prior Publication Data

US 2007/0236199 A1    Oct. 11, 2007

(30) Foreign Application Priority Data

Apr. 10, 2006   (JP) .............................. 2006-107143

(51) Int. Cl.
*G05F 1/613* (2006.01)
*G05F 1/62* (2006.01)

(52) U.S. Cl. ...................... 323/282; 323/222

(58) Field of Classification Search ................ 323/222, 323/223, 282, 284, 285
See application file for complete search history.

(56) References Cited

U.S. PATENT DOCUMENTS 5,705,919 A * 1/1998 Wilcox ....................... 323/282
7,061,215 B2 * 6/2006 Harris ......................... 323/268
7,245,116 B2 * 7/2007 Tateno et al. ................ 323/316
7,265,601 B2 * 9/2007 Ahmad ....................... 327/403

FOREIGN PATENT DOCUMENTS

JP          2005-160198        6/2005

* cited by examiner

*Primary Examiner*—Gary L Laxton
(74) *Attorney, Agent, or Firm*—Fish & Richardson P.C.

(57) ABSTRACT

A step-up DC/DC converter uses N-channel field-effect transistors as both an output transistor and a synchronous-rectification transistor and includes a first driver making the gate voltage of the output transistor pulsate between a ground voltage and an input voltage and a second driver making the gate voltage of the synchronous-rectification transistor pulsate between a switching voltage and a bootstrap voltage equal to the switching voltage plus at least the ON threshold voltage of the synchronous-rectification transistor. With this configuration, the converter operates with improved power efficiency and performs synchronous rectification unhindered even with a small input-output voltage difference.

6 Claims, 4 Drawing Sheets

STEP-UP DC/DC CONVERTER AND ELECTRONIC APPLIANCE THEREWITH

This application is based on Japanese Patent Application No. 2006-107143 filed on Apr. 10, 2006, the contents of which are hereby incorporated by reference.

BACKGROUND OF THE INVENTION

1. Field of the Invention

The present invention relates to a synchronous-rectification step-up DC/DC (direct-current to direct-current) converter, and also relates to an electronic appliance incorporating such a DC/DC converter.

2. Description of Related Art

Conventionally, as a type of means for supplying stabilized electric power with little heat loss and with comparatively high efficiency when there is a large input-output difference, there have been widely used step-up DC/DC converters (so-called switching regulators) that produce a desired output voltage from an input voltage by driving an energy storage element (such as a capacitor or inductor) through the switching of an output transistor (through the control of its duty).

In particular, in switching regulators that are required to offer high conversion efficiency, with a view to minimizing the ON resistance of a rectification element, as shown in FIG. 4A, a synchronous-rectification transistor P1 is used as a rectification element, and it is switched complementarily with respect to an output transistor N1.

As a conventional technique (for reducing power loss at switching) related to the foregoing, JP-A-2005-160198 discloses and proposes a step-up DC/DC converter in which, as shown in FIG. 4B, the gate voltage of an output transistor N1 is swung between a ground voltage GND and an input voltage Vin and meanwhile the gate of a synchronous-rectification transistor P1 is swung between the input voltage Vin and an output voltage Vout.

Certainly, with the synchronous-rectification step-up DC/DC converter shown in FIG. 4A, it is possible to minimize the ON resistance of the rectification element, and thereby to obtain higher conversion efficiency.

Disadvantageously, however, in the step-up DC/DC converter shown in FIG. 4A, a P-channel field-effect transistor is used as the synchronous-rectification transistor P1, and in addition the synchronous-rectification transistor P1 is driven as a result of its gate voltage being made to pulsate between the ground voltage GND and the output voltage Vout by a second driver DRV2 that receives the output voltage Vout as a positive supply voltage; consequently, in the step-up DC/DC converter shown in FIG. 4A, as compared with a first driver DRV1 that receives the input voltage Vin as a positive supply voltage, the second driver DRV2 that receives the output voltage Vout as a positive supply voltage produces more power loss (resulting in increased power loss in the entire step-up DC/DC converter).

On the other hand, certainly, with the step-up DC/DC converter shown in FIG. 4B, where the drive current of the second driver DRV2 is fed back to the input terminal, it is possible to overcome the disadvantage mentioned above.

Inconveniently, however, in the step-up DC/DC converter shown in FIG. 4B, in case a fall or variation in the input voltage Vin (as results from a battery) is such that the potential difference between the input voltage Vin and the output voltage Vout is smaller than the ON threshold voltage of the synchronous-rectification transistor P1, it is no longer possible to turn the synchronous-rectification transistor P1 ON.

SUMMARY OF THE INVENTION

An object of the present invention is to provide a step-up DC/DC converter that operates with improved power efficiency and that performs synchronous rectification unhindered even with a small input-output voltage difference.

To achieve the above object, according to one aspect of the present invention, a step-up DC/DC converter includes: an output transistor of an N-channel field-effect type; a synchronous-rectification transistor of an N-channel field-effect type; an energy storage element of which a first end is connected to the output transistor and to the synchronous-rectification transistor and of which a second end is connected to a point to which an input voltage is applied; a control circuit switching the output transistor and the synchronous-rectification transistor complementarily; a first driver making the gate voltage of the output transistor pulsate between a ground voltage and the input voltage; a second driver making the gate voltage of the synchronous-rectification transistor pulsate between a switching voltage appearing at the first end of the energy storage element and a bootstrap voltage equal to the switching voltage plus at least the ON threshold voltage of the synchronous-rectification transistor; an output smoother smoothing the switching voltage to output a desired output voltage.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

Hereinafter, the present invention will be described by way of an embodiment in which it is applied to a step-up DC/DC converter incorporated in a cellular phone device to produce from the output voltage of a battery a drive voltage to be supplied to different parts (e.g., a TFT—thin-film transistor—liquid crystal panel) of the terminal.

Figure 1:
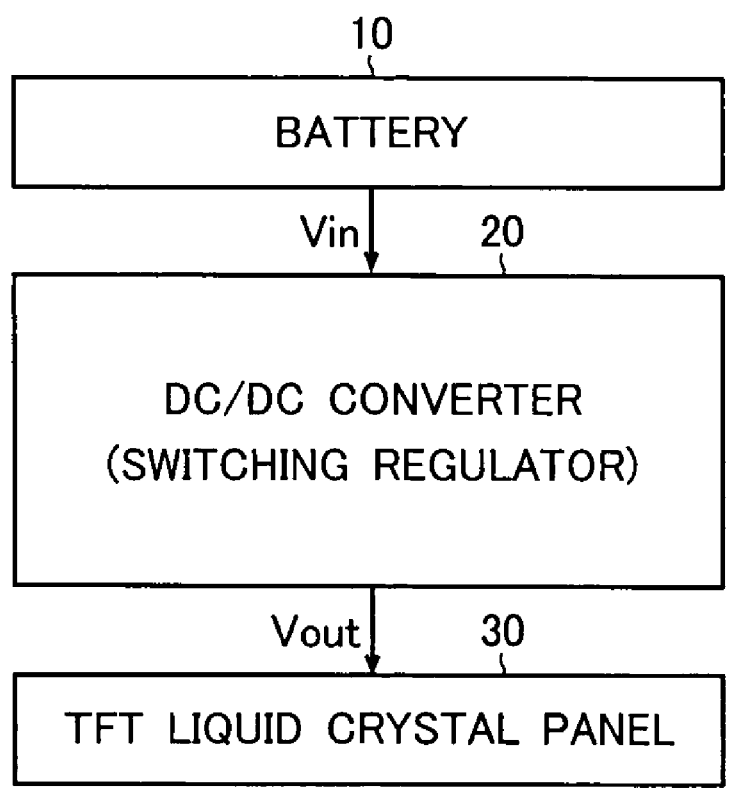
FIG. 1 is a block diagram showing a cellular phone device as an embodiment of the invention.

FIG. 1 is a block diagram showing a cellular phone device as an embodiment of the invention (and showing, in particular, the power supply system for a TFT liquid crystal panel). As shown there, in this embodiment, the cellular phone device includes: a battery 10 as a device power source; a step-up DC/DC converter 20 as means for converting the output of the battery 10; and a TFT liquid crystal panel 30 that the cellular phone device uses as means of display. Needless to say, other than the components already mentioned, the cellular phone device further includes various components as means for achieving its essential capabilities (e.g., those for communication), such as a transmission/reception circuit, a loudspeaker, a microphone, a display, an operation panel, and a memory.

The step-up DC/DC converter 20 produces from an input voltage Vin supplied from the battery 10 a constant output voltage Vout, and supplies the output voltage Vout to the TFT liquid crystal panel 30.

Figure 2:
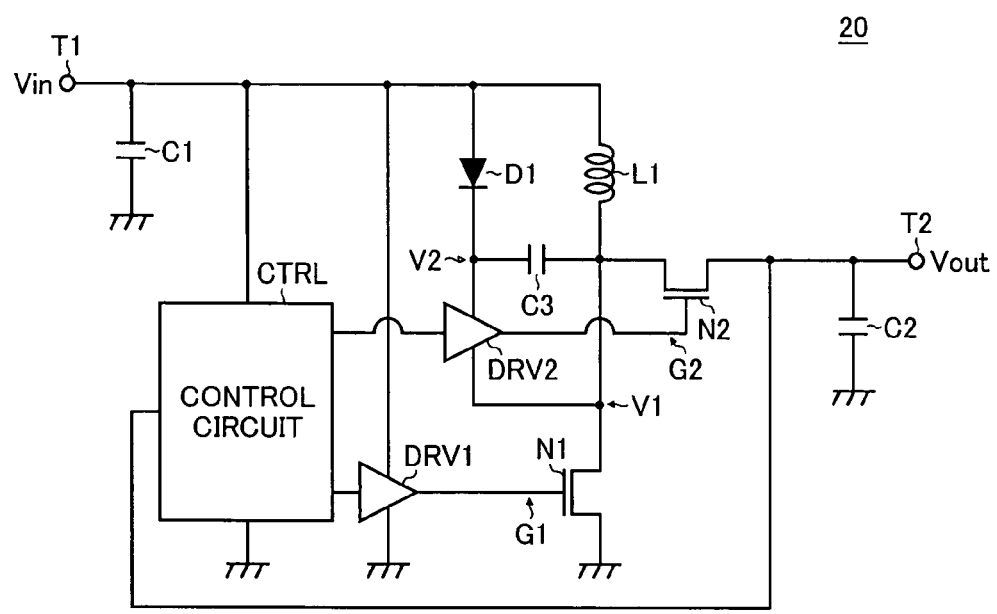
FIG. 2 is a circuit diagram showing an example of the configuration of a step-up DC/DC converter 20.

FIG. 2 is a circuit diagram (including a block as a part of it) showing an example of the configuration of the step-up DC/DC converter 20.

As shown in FIG. 2, in this embodiment, the step-up DC/DC converter 20 includes an input terminal T1, an output terminal T2, an input smoothing capacitor C1, and output smoothing capacitor C2, an inductor L1, N-channel field-effect transistors N1 and N2, a capacitor C3, a diode D1, a first and a second driver DRV1 and DRV2, and a control circuit CTRL.

Via the input terminal T1, the input voltage Vin from the battery 10—serving as a device power source—is fed in. Via the output terminal T2, the output voltage Vout to be supplied to the TFT liquid crystal panel 30 (unillustrated in FIG. 2)—serving as a load—is fed out.

The input smoothing capacitor C1 serves as means for smoothing the input voltage Vin. A first end of the input smoothing capacitor C1 is connected to the input terminal T1, and a second end of the input smoothing capacitor C1 is grounded. The output smoothing capacitor C2 serves as means for smoothing the output voltage Vout. A first end of the output smoothing capacitor C2 is connected to the output terminal T2, and a second end of the output smoothing capacitor C2 is grounded.

The inductor L1 serves as an energy storage element. A first end of the inductor L1 is connected to the drain of the transistor N1 and to the source of the transistor N2. A second end of the inductor L1 is connected to the input terminal T1.

The drain of the transistor N1 is, as already described, connected to the first end of the inductor L1. The source of the transistor N1 is grounded. The gate of the transistor N1 is connected to the output terminal of the first driver DRV1. Thus, the transistor N1 functions as an output transistor that is switched according to its gate voltage G1 fed from the first driver DRV1.

The source of the transistor N2 is, as already described, connected to the first end of the inductor L1. The drain of the transistor N2 is connected to the output terminal T2. The gate of the transistor N2 is connected to the output terminal of the second driver DRV2. Thus, the transistor N2 functions as a synchronous-rectification transistor that is switched according to its gate voltage G2 fed from the second driver DRV2.

A first end of the capacitor C3 is connected to the first end of the inductor L1. The anode of the diode D1 is connected to the input terminal T1. The cathode of the diode D1 is connected to a second end of the capacitor C3. These elements together function as means for generating a bootstrap voltage V2, which will be described in detail later.

The positive supply voltage terminal of the first driver DRV1 is connected to the input terminal T1. The negative supply voltage terminal of the first driver DRV1 is grounded. The output terminal of the first driver DRV1 is, as already described, connected to the gate of the transistor N1. Thus, the first driver DRV1 functions as first driving means for driving the gate voltage G1 of the transistor N1 to pulsate between the ground voltage GND and the input voltage Vin.

The positive supply voltage terminal of the second driver DRV2 is connected to the cathode of the diode D1. The negative supply voltage terminal of the second driver DRV2 is connected to the second end of the inductor L1. The output terminal of the second driver DRV2 is, as already described, connected to the gate of the transistor N2. Thus, the second driver DRV2, cooperating with the capacitor C3 and the diode D1 mentioned already, functions as second driving means for driving the gate voltage G2 of the transistor N2 to pulsate between a switching voltage V1 appearing at the first end of the inductor L1 and the bootstrap voltage V2, which will be described in detail later.

The control circuit CTRL serves as means for monitoring the output voltage Vout, while it is produced by stepping-up the input voltage Vin, and keeping it at a desired level by switching, via the first and second drivers DRV1 and DRV2, the output transistor N1 and the synchronous-rectification transistor N2 complementarily with respect to each other.

The control circuit CTRL can be configured in light of well-known techniques, and therefore no detailed description of its internal configuration will be given. For example, the control circuit CTRL may be configured as follows: an error voltage commensurate with the difference between the output voltage Vout (or, more typically, a voltage obtained by dividing it) and a predetermined reference voltage (corresponding to the target level of the output voltage Vout) is extracted, and then the error voltage is compared with a predetermined slope voltage (having a ramped or triangular waveform) to generate a PWM (pulse width modulation) signal; then, the first and second drivers DRV1 and DRV2 are driven with the PWM signal.

In the present specification, "complementarily" denotes that the ON/OFF states of the output transistor N1 and the synchronous-rectification transistor N2 are reversed with respect to each other, including not only cases where they are exactly so but also cases where, with a view to preventing a through current, they are reversed with a predetermined delay introduced so as never to make the two transistors N1 and N2 simultaneously ON.

Next, how the step-up DC/DC converter 20 configured as described above achieves direct-current to direct-current conversion will be described in detail below with reference to, in addition to FIG. 2, FIG. 3.

Figure 3:
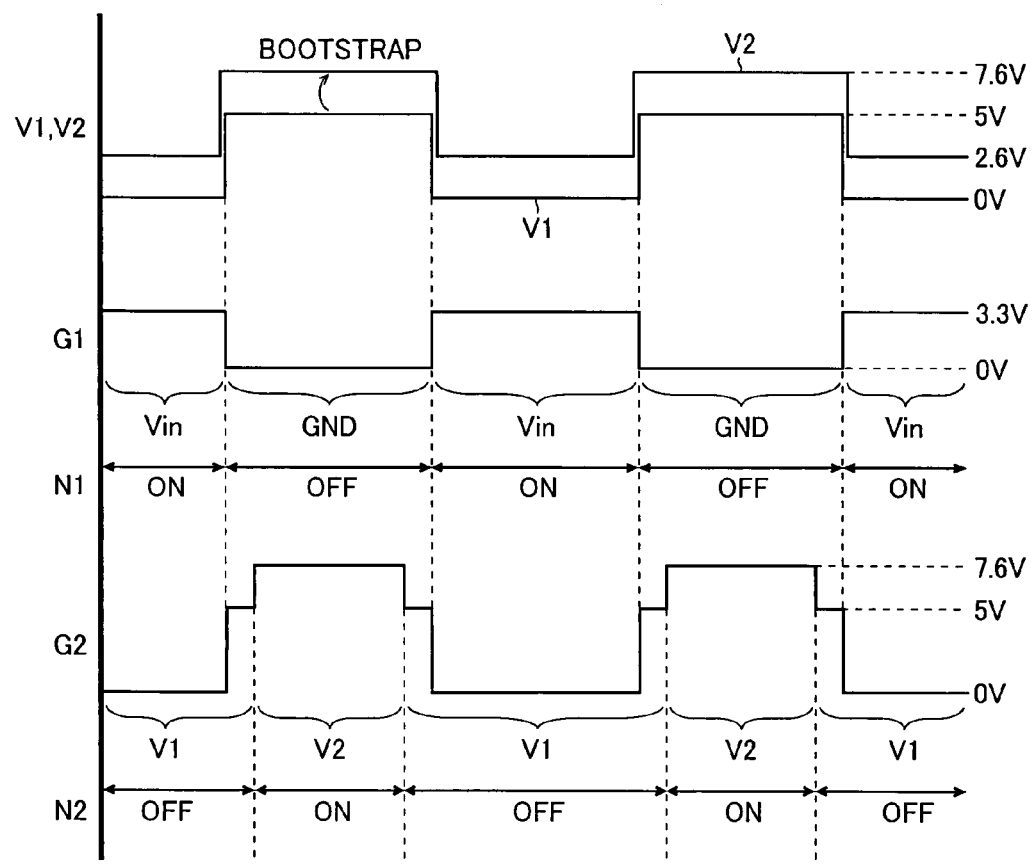
FIG. 3 is a timing chart showing the behavior of a switching voltage V1, a bootstrap voltage V2, and gate voltages G1 and G2 along with the ON/OFF states of the transistors N1 and N2.
Figure 4A:
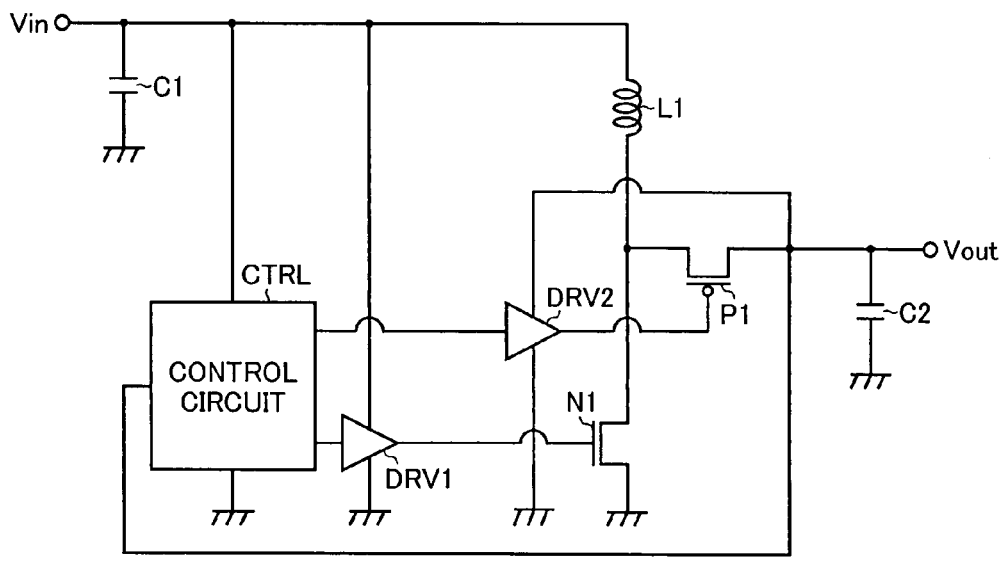
FIGS. 4A and 4B are circuit diagrams showing examples of conventional step-up DC/DC converters.
Figure 4B:
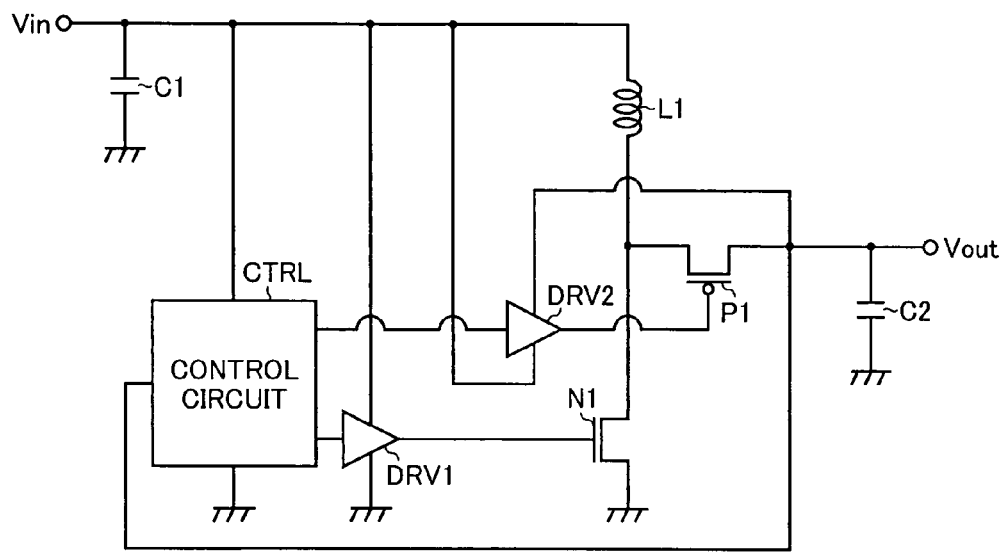

FIG. 3 is a timing chart showing the behavior of the switching voltage V1, the bootstrap voltage V2, and the gate voltages G1 and G2 along with the ON/OFF states of the transistors N1 and N2. FIG. 3 shows a case where the input voltage Vin is 3.3 V and the output voltage Vout is 5 V.

First, the first driver DRV1 turns the gate voltage G1 high (i.e., equal to input voltage Vin), and thus the output transistor N1 turns on. As a result, a current flows through the inductor L1 via the output transistor N1 toward ground, and this causes electric energy stored in the inductor L1. Meanwhile, the switching voltage V1 at the first end of the inductor L1 remains, via the output transistor N1, approximately equal to the ground voltage GND (0 V).

When the output transistor N1 turns on, a current flows, not only through the inductor L1, but also through the diode D1 and the capacitor C3 via the output transistor N1 toward ground. This causes electric charge to be stored in the capacitor C3 and, as a result, across the capacitor C3 appears a potential difference (2.6 V) that equals the input voltage Vin minus the forward voltage drop Vf (0.7 V) across the diode D1. Thus, the bootstrap voltage V2 fed to the positive supply voltage terminal of the second driver DRV2 equals the switching voltage V1 plus the charge voltage (2.6 V) of the capacitor C3.

In this ON period of the output transistor N1, if electric charge has previously been stored in the output smoothing capacitor C2, a current flows from the output smoothing capacitor C2 to the TFT liquid crystal panel 30 (unillustrated in FIG. 2), which serves as a load. Moreover, during the ON period of the output transistor N1, the second driver DRV2 keeps the gate voltage G2 low (i.e., equal to the switching voltage V1), and the synchronous-rectification transistor N2 is kept in the OFF state complementarily with respect to the ON state of the output transistor N1. Thus, no current flows from the output smoothing capacitor C2 toward the output transistor N1.

Next, the first driver DRV1 turns the gate voltage G1 low (i.e., equal to the ground voltage GND), and thus the output transistor N1 turns off. Now, the back electromotive force generated in the inductor L1 causes the electric energy stored in it to be released. This raises the switching voltage V1 appearing at the first end of the inductor L1 to a high-potential level (here, equal to the output voltage Vout, i.e., 5 V) higher than the input voltage Vin.

On the other hand, after the output transistor N1 turns off, a predetermined "both-OFF" period elapses, at the end of which the second driver DRV2 turns the gate voltage G2 high (i.e., equal to the bootstrap voltage V2). At this point, since the potential difference produced in the previous charging of the capacitor C3 has been maintained across it, the bootstrap voltage V2 equals the switching voltage V1 (5 V) plus the charge voltage (2.6 V) of the capacitor C3.

Now, the potential difference between the gate and source of the synchronous-rectification transistor N2 is larger than its ON threshold voltage, and thus the synchronous-rectification transistor N2 goes into the ON state complementarily with respect to the OFF state of the output transistor N1. As a result, the current flowing from the input terminal T1 via the synchronous-rectification transistor N2 flows into the TFT liquid crystal panel 30, and also flows via the output smoothing capacitor C2 to ground, thereby charging the output smoothing capacitor C2.

The operations described above are repeated so that the direct-current output smoothed by the output smoothing capacitor C2 is supplied to the TFT liquid crystal panel 30, which serves as a load.

As described above, the step-up DC/DC converter 20 of the embodiment is configured as a step-up DC/DC converter that produces from an input voltage Vin a desired output voltage Vout by driving one end (first end) of an inductor L1 through complementary switching of an output transistor N1 and a synchronous-rectification transistor N2. Here, used as the output transistor N1 and the synchronous-rectification transistor N2 are both N-channel field-effect transistors. Moreover, there are further provided: first driving means (a first driver DRV1) for making the gate voltage G1 of the output transistor N1 to pulsate between a ground voltage GND and the input voltage Vin; and second driving means (a second driver DRV2) for making the gate voltage G2 of the synchronous-rectification transistor N2 between a switching voltage V1 appearing at the one end (first end) of the inductor L1 and a bootstrap voltage V2 equal to the switching voltage V1 plus at least the ON threshold voltage of the synchronous-rectification transistor N2.

In brief, in the step-up DC/DC converter 20 of the embodiment, an N-channel field-effect transistor is used as a synchronous-rectification transistor, instead of a P-channel one as conventionally used. Moreover, as the positive supply voltage to the second driver DRV2, instead of the output voltage Vout, the bootstrap voltage V2 generated from the input voltage Vin by the capacitor C3 and the diode D1 is used, with the result that the output voltage Vout is fed to none of the components that are involved in the driving of the output transistor N1 and the synchronous-rectification transistor N2, namely the first and second drivers DRV1 and DRV2 and the control circuit CTRL.

This configuration offers, for example, an advantage as follows. Suppose the input voltage Vin is 5 V, the output voltage Vout is 12 V, and the drive current of the second driver DRV2 is 10 mA. If, as conventionally practiced, the drive current of the second driver DRV2 is consumed from the output side, the resulting power loss is 12 V×10 mA=120 mW. By contrast, if, according to the present invention, the drive current of the second driver DRV2 is consumed from the input side, the resulting power loss is as small as 5 V×10 mA=50 mW. Thus, the power loss is reduced by as much as 70 mW.

Moreover, with the step-up DC/DC converter 20 of the embodiment, the charge voltage of the capacitor C3 is maintained, and thus, irrespective of the potential difference between the input voltage Vin and the output voltage Vout, the potential difference between the gate and source of the synchronous-rectification transistor N2 is kept higher than its ON threshold voltage. Thus, the step-up DC/DC converter 20 of the embodiment performs synchronous rectification unhindered even when the potential difference between the input voltage Vin and the output voltage Vout is small.

The embodiment described above deals with a case where the present invention is applied to a step-up DC/DC converter that is incorporated in a cellular phone device to serve as means for converting the output of a battery; this, however, is not meant to limit the application of the invention in any way; the invention finds wide application in step-up DC/DC converters incorporated in any other types of electronic appliances. For example, a DC/DC converter according to the invention may be used as means for stepping up a direct-current voltage obtained from an AC/DC converter.

The present invention may be practiced in any other manner than specifically described as an embodiment above, with any modification or variation made within the sprit of the invention.

For example, although the embodiment described above deals with a case where a capacitor C3 and a diode D1 are used to generate the bootstrap voltage V2 directly from the input voltage Vin, this is not meant to limit in any way how the invention should be practiced; the configuration described above may be additionally provided with, between the input terminal T1 and the anode of the diode D1, a regulator for stepping-down the input voltage Vin to produce a desired constant voltage so that the bootstrap voltage V2 is generated from the constant voltage produced by the regulator.

This configuration is suitably used, for example, in a case where the input voltage Vin is 12 V, whereas the withstand voltage of the second driver DRV2 is 5 V. In such a case, inserting the above-mentioned regulator to produce an appropriate constant voltage (e.g., 5 V) from the input voltage Vin and generating the bootstrap voltage V2 from that constant voltage eliminates the need to increase the design withstand voltage of the second driver DRV2, and thus helps avoid an unnecessary increase in device scale.

Although the embodiment described above deals with a case where the output voltage Vout alone is fed back to the control circuit CTRL, this is not meant to limit in any way how the invention should be practiced; instead, the output transistor N1 and the synchronous-rectification transistor N2 may be switched according to the results of the monitoring of their switching currents or output currents (by so-called current mode control).

In addition to the components specifically mentioned above, the step-up DC/DC converter 20 may further include, as necessary, other protection circuit blocks (such as a low-input malfunction prevention circuit and a temperature protection circuit).

In terms of advantages, step-up DC/DC converters according to the invention and electronic appliances incorporating them operate with improved power efficiency and perform synchronous rectification unhindered even with a small input-output voltage difference.

In terms of industrial applicability, the present invention is useful in reducing the power loss of synchronous-rectification switching regulators, and finds wide application in all kinds of electronic appliances (e.g., liquid crystal television monitors, liquid crystal panels, and cellular phone devices operating from batteries).

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention which fall within the true spirit and scope of the invention.

What is claimed is:

1. A step-up DC/DC converter comprising:
an output transistor of an N-channel field-effect type;
a synchronous-rectification transistor of an N-channel field-effect type;
an energy storage element of which a first end is connected to the output transistor and to the synchronous-rectification transistor and of which a second end is connected to a point to which an input voltage is applied;
a first driver making a gate voltage of the output transistor pulsate between a ground voltage and the input voltage;
a second driver making a gate voltage of the synchronous-rectification transistor pulsate between a switching voltage appearing at the first end of the energy storage element and a bootstrap voltage equal to the switching voltage plus at least an ON threshold voltage of the synchronous-rectification transistor; and
an output smoother smoothing the switching voltage to output a desired output voltage; and
a control circuit directly fed with the output voltage as an output feedback signal and switching, based on the output voltage only, the output transistor and the synchronous-rectification transistor complimentarily via the first and second drivers.

2. A step-up DC/DC converter comprising:
an input terminal via which an input voltage is fed in;
an output terminal via which an output voltage is fed out;
an output smoothing capacitor of which a first end is connected to the output terminal and of which a second end is connected to ground;
an inductor of which a first end is connected to the input terminal;
an output transistor of an N-channel field-effect type of which a drain is connected to a second end of the inductor and of which a source is grounded;
an synchronous-rectification transistor of an N-channel field-effect type of which a source is connected to the second end of the inductor and of which a drain is connected to the output terminal;
a boot capacitor of which a first end is connected to the second end of the inductor;
a diode of which an anode is connected to the input terminal and of which a cathode is connected to a second end of the capacitor;
a first driver of which a positive supply voltage terminal is connected to the input terminal, of which a negative supply voltage terminal is grounded, and of which an output terminal is connected to a gate of the output transistor;
a second driver of which a positive supply voltage terminal is connected to the cathode of the diode, of which a negative supply voltage terminal is connected to the second end of the inductor, and of which an output terminal is connected to a gate of the synchronous-rectification transistor; and
a control circuit directly fed with the output voltage as an output feedback signal and switching, based on the output voltage only, the output transistor and the synchronous-rectification transistor complementarily via the first and second drivers.

3. The DC/DC converter of claim 2, further comprising:
a regulator inserted between the input terminal and the anode of the diode, the regulator stepping down the input voltage to produce a desired constant voltage.

4. An electronic appliance comprising:
a power source; and
a DC/DC converter stepping up an input voltage supplied from the power source to produce a desired output voltage,
wherein the DC/DC converter comprises:
an output transistor of an N-channel field-effect type;
a synchronous-rectification transistor of an N-channel field-effect type;
an energy storage element of which a first end is connected to the output transistor and to the synchronous-rectification transistor and of which a second end is connected to a point to which an input voltage is applied;
a first driver making a gate voltage of the output transistor pulsate between a ground voltage and the input voltage;
a second driver making a gate voltage of the synchronous-rectification transistor pulsate between a switching voltage appearing at the first end of the energy storage element and a bootstrap voltage equal to the switching voltage plus at least an ON threshold voltage of the synchronous-rectification transistor; and
an output smoother smoothing the switching voltage to output a desired output voltage; and
a control circuit directly fed with the output voltage as an output feedback signal and switching, based on the output voltage only, the output transistor and the synchronous-rectification transistor complimentarily via the first and second drivers.

5. An electronic appliance comprising:
a power source; and
a DC/DC converter stepping up an input voltage supplied from the power source to produce a desired output voltage,
wherein the DC/DC converter comprises:
an input terminal via which the input voltage is fed in;
an output terminal via which the output voltage is fed out;
an output smoothing capacitor of which a first end is connected to the output terminal and of which a second end is connected to ground;
an inductor of which a first end is connected to the input terminal;
an output transistor of an N-channel field-effect type of which a drain is connected to a second end of the inductor and of which a source is grounded;
an synchronous-rectification transistor of an N-channel field-effect type of which a source is connected to the second end of the inductor and of which a drain is connected to the output terminal;
a boot capacitor of which a first end is connected to the second end of the inductor;

a diode of which an anode is connected to the input terminal and of which a cathode is connected to a second end of the capacitor;

a first driver
of which a positive supply voltage terminal is connected to the input terminal,
of which a negative supply voltage terminal is grounded, and
of which an output terminal is connected to a gate of the output transistor;

a second driver
of which a positive supply voltage terminal is connected to the cathode of the diode,
of which a negative supply voltage terminal is connected to the second end of the inductor, and
of which an output terminal is connected to a gate of the synchronous-rectification transistor; and a control circuit directly fed with the output voltage as an output feedback signal and switching, based on the output voltage only, the output transistor and the synchronous-rectification transistor complementarily via the first and second drivers.

6. The electronic appliance of claim 5, wherein the DC/DC further comprises:

a regulator inserted between the input terminal and the anode of the diode, the regulator stepping down the input voltage to produce a desired constant voltage.

* * * * *